United States Patent [19]

Allen et al.

[11] Patent Number: 4,578,637

[45] Date of Patent: Mar. 25, 1986

[54] CONTINUITY/LEAKAGE TESTER FOR ELECTRONIC CIRCUITS

[75] Inventors: Richard J. Allen, Sunnyvale; Richard W. Youden, Cupertino, both of Calif.

[73] Assignee: Signetics Corporation, Sunnyvale, Calif.

[21] Appl. No.: 597,772

[22] Filed: Apr. 6, 1984

[51] Int. Cl.⁴ ............................................. G01R 15/12
[52] U.S. Cl. .................................. 324/73 PC; 324/51
[58] Field of Search ............. 324/51, 73 PC; 364/489, 364/490

[56] References Cited

U.S. PATENT DOCUMENTS 3,851,161  11/1974  Sloop ............................. 324/73 PC
3,963,981  6/1976  Vis ........................................ 324/51

FOREIGN PATENT DOCUMENTS 1900298  6/1970  Fed. Rep. of Germany ... 324/73 PC
1587043  3/1981  United Kingdom .

*Primary Examiner*—Stanley T. Krawczewicz
*Attorney, Agent, or Firm*—R. J. Meetin; R. T. Mayer; T. A. Briody

[57] ABSTRACT

A device for testing continuity and current leakage at leads of an electronic circuit such as an integrated circuit has a contact structure (16) having test terminals (T1–T28) for contacting the leads. A first and a second of the leads are power supply leads respectively contactable with a first and a second of the test terminals (T14 and T28 or T26). Continuity/leakage detection is done with one or more corresponding detection circuits (D1–D28). Each detection circuit has a channel along which both continuity and leakage are tested. A supply switching circuit (26) appropriately switches voltages between values suitable for continuity testing and values suitable for leakage testing.

11 Claims, 6 Drawing Figures

CONTINUITY TEST CONDITIONS

LEAKAGE TEST CONDITIONS

CONTINUITY/LEAKAGE TESTER FOR ELECTRONIC CIRCUITS

BACKGROUND OF THE INVENTION

1. Field of the Invention

This invention relates to devices for testing electronic circuits.

2. Description of the Prior Art

A packaged integrated circuit (IC) in which a set of electrical leads (or pins) extends from an IC chip housed within a package is conventionally tested with a parametric tester that performs functional tests on the IC. Because the parametric tester has many precision components, it is expensive. Skilled personnel are needed to run the tester and interpret the results which often turn out to be largely a go/no go decision. If there are failures in continuity or current leakage, the specific leads at which these failures occur may not be identified.

V. Vis discloses a leakage/continuity tester for medical equipment in U.S. Pat. No. 3,963, 981. This testing device has a set of lights that indicate whether specific limits in continuity and leakage have been exceeded. Consequently, it is not necessary to train the operator about the particular limits. Leakage and continuity testing are done along separate channels. While the two-channel approach may be suitable for testing medical instruments, it could be unnecessarily expensive for an IC in which many leads must be tested for both continuity and leakage. It would be desirable to have an easy-to-operate IC continuity/leakage tester patterned somewhat along the lines of Vis but utilizing a minimum number of components so as to keep cost low.

SUMMARY OF THE INVENTION

The invention is a device for testing continuity and current leakage in an electronic circuit, such as an IC, having a set of leads of which a first and a second are supply voltage leads. The testing device has a contact structure having test terminals for contacting the leads on a one-to-one basis. A first and a second of the test terminals are respectively contactable with the first and second leads.

Continuity/leakage detection at the leads is performed with one or more detection circuits corresponding on a one-to-one basis to at least part of the test terminals. Each detection circuit contains a resistor and a comparing circuit. The resistor is coupled between the corresponding test terminal and a supply point in the tester. The comparing circuit has a first input terminal coupled to the corresponding test terminal for receiving an input voltage, a second input terminal at a reference voltage, and an output terminal for providing an output signal at one of two opposite states depending on whether the input and reference voltages achieve a specified relationship. Each detection circuit preferably includes a display element such as a light-emitting (LED) for providing a visual representation of the state of the output signal.

The transition between leakage and continuity test modes is done with a supply switching circuit. It provides the first test terminal with a first test supply voltage. It also provides the supply point with a detection supply voltage. The supply switching circuit switches the supply voltages between values suitable for testing continuity at the leads and values suitable for testing for current leakage from one or more selected leads to the first lead. The supply switching circuit preferably provides the second test terminal with a second test supply voltage for testing for current leakage from one or more selected leads to the second lead.

Usage of the supply switching circuit enables continuity and leakage testing for each lead to be performed along the same channel in that lead's detection circuit. This yields substantial savings in the number of components. Their tolerances are typically not critical. As a result, the testing device is quite inexpensive.

The present tester is simple to operate. The operator merely places the leads of the circuit to be tested in appropriate contact with the contact structure and flips several switches. The continuity or leakage condition at the leads is readily apparent from the corresponding display elements which are normally arranged in a convenient array. An active (or lighted) condition of the display element for each lead usually show absence of continuity or existence of leakage at that lead. These features make the invention useful both in the field and in normal testing for identifying repetitive problems.

BRIEF DESCRIPTION OF THE DRAWINGS

Like reference symbols are employed in the drawings and in the description of the preferred embodiment to represent the same or very similar item or items.

DESCRIPTION OF THE PREFERRED EMBODIMENT

Figure 1:
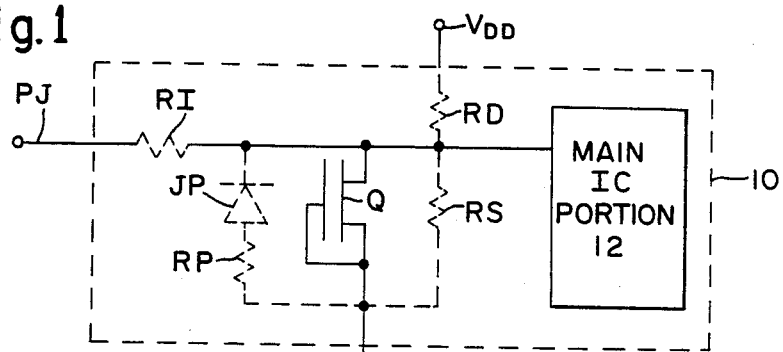
FIG. 1 is a circuit diagram of a portion of a typical packaged N-channel metal-oxide semiconductor (MOS) IC.

Referring to the drawings, FIG. 1 shows a portion of a typical packaged N-channel MOS IC 10 having an electrical lead PJ which extends from a main portion 12 of IC 10 to a point outside the packaged section. This lead is one of a set of such leads extending outside IC 10. Low and high supply voltages $V_{SS}$ and $V_{DD}$ whose difference is the IC power supply voltage are provided on two others of these leads.

Hanging from each lead PJ except the $V_{SS}$ and $V_{DD}$ leads is a corresponding enhancement-mode N-channel MOS field-effect transistor (FET) Q. Its source is connected to lead PJ, while its drain and gate are connected together and to the $V_{SS}$ lead. FET Q thereby functions as a diode to provide over-voltage protection. The N-type source of FET Q forms a parasitic PN diode JP with adjacent P-type semiconductor material. In the absence of a substrate back bias voltage, the P-type material is at voltage $V_{SS}$. The combined resistance of the P-type material and the internal resistance of diode JP is represented by a resistor RP.

Importantly, diode JP and/or FET Q provide(s) a way for checking continuity at lead PJ—i.e., determining whether there is a sufficiently conductive path extending from main IC portion 12 to the portion of lead PJ outside the packaged section of IC 10. A resistor RI along lead PJ represents the extent to which this conductive path exists. Continuity testing at lead PJ is done by placing the $V_{SS}$ lead at a voltage sufficiently above the voltage at lead PJ that either or both of diode Jp and FET Q turn on. If current above a specified level flows between lead PJ and the $V_{SS}$ lead, continuity is present. If less or no current flow occurs, there is a lack of continuity at lead PJ.

Some current leakage normally occurs from lead PJ to the $V_{SS}$ and $V_{DD}$ leads. The leakage paths are respectively represented by a resistor RS connected between the PJ and $V_{SS}$ leads and by a resistor RD connected between the PJ and $V_{DD}$ leads. If leakage to the $V_{SS}$ or $V_{DD}$ lead is great enough, IC 10 will not operate properly. A leakage failure occurs.

Leakage from lead PJ to the $V_{SS}$ and $V_{DD}$ leads is checked by placing each of them at a voltage below the voltage at lead PJ. If leakage to the $V_{SS}$ and $V_{DD}$ leads is checked simultaneously, the voltage at the $V_{DD}$ lead is set at a higher value than that at the $V_{SS}$ lead so as to simulate normal circuit operating conditions. The direction in which (positive) leakage current flows between the PJ and $V_{SS}$ leads is opposite to the direction in which (positive) current flows between the PJ and $V_{SS}$ leads when there is continuity.

Figure 2:
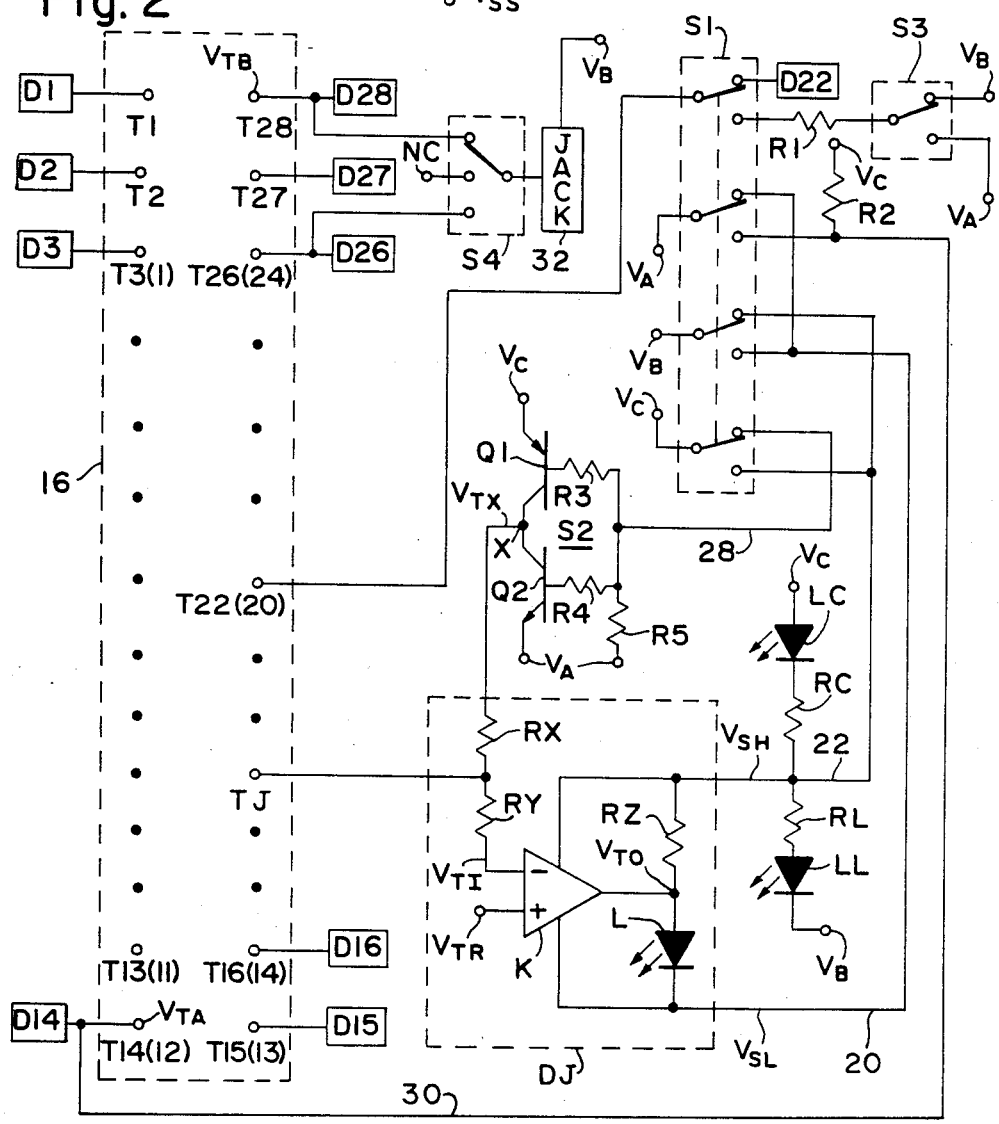
FIG. 2 is a circuit diagram of an embodiment of a continuity/leakage tester in accordance with the invention.
Figure 3:
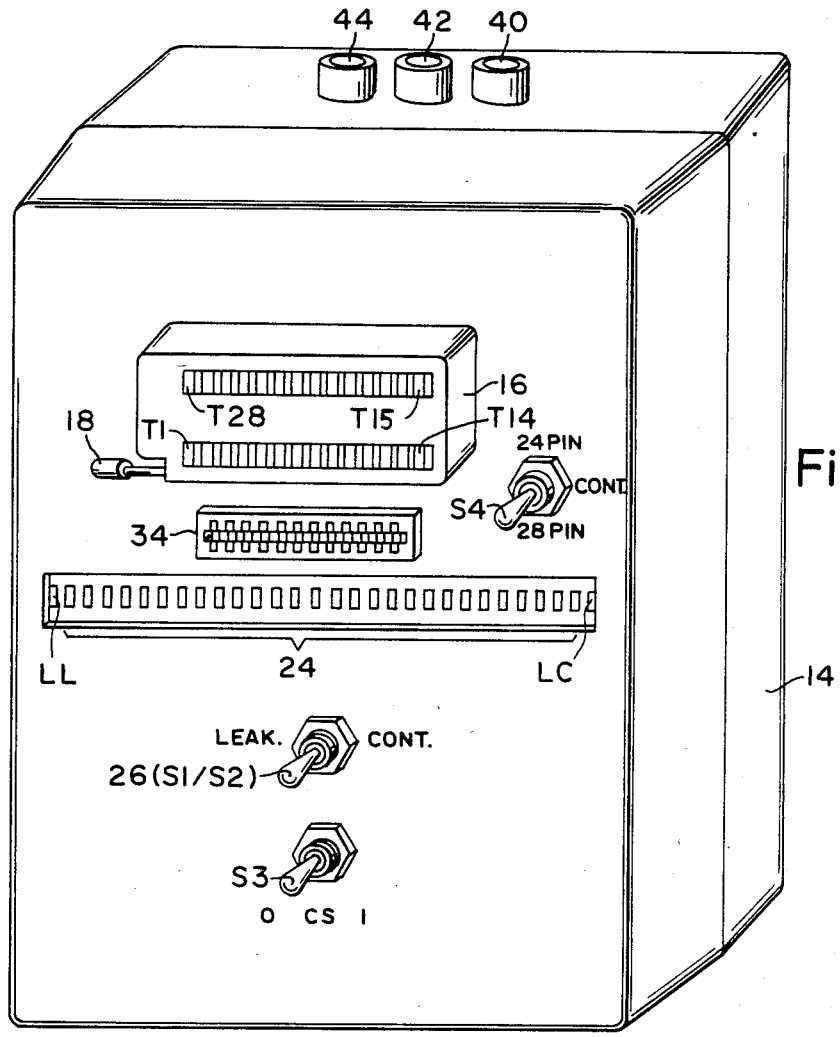
FIG. 3 is a perspective structural view of the tester of FIG. 2.

FIG. 2 illustrates a circuit layout of a device for testing continuity and current leakage in a packaged integrated circuit such as IC 10. FIG. 3 shows a corresponding physical layout. Although the following discussion of this tester applies specifically to testing MOS IC's, it may as well be used to check continuity/leakage in bipolar IC's. In this case, one or more other rectifying elements replace diode JP and FET Q at each lead except the supply voltage leads.

The tester is housed in a box 14 on which a contact structure 16 is mounted. Structure 16 has a group 28 test terminals T1, T2, T3, ... T14, T15, ... TJ, ... T26, T27, and T28 for contacting leads (or pins) of a dual-in-line packaged IC having 24 or 28 leads. Typical terminal TJ contacts typical lead PJ during testing. If the IC has 28 leads, terminal T14 contacts the $V_{SS}$ lead while terminal T28 contacts the $V_{DD}$ lead. If the IC has 24 leads, terminals T1, T2, T27, and T28 are not used. Terminal T3 is the first terminal for the 24-lead IC, and terminal T26 is the 24th terminal. This is indicated by the parenthetical numbering for terminals T3-T26 in FIG. 2. For the 24-lead IC, terminal T14 (12) still contacts the $V_{SS}$ lead, but terminal T26 (24) contacts the $V_{DD}$ lead.

Contact structure 16 is a conventional type of socket having terminals T1-T14 in one row and terminals T15-T28 in another row. The terminal spacing is the same as the lead spacing of the IC's to be tested. Terminals T1-T28 are slotted elements that respectively receive the IC leads. A conventional locking mechanism controlled by a switch (or latch) 18 keeps the IC from separating from structure 16 during test.

continuity/leakage detection is performed with a group of 28 identical detection circuits D1, ... DJ, ... and D28 respectively coupled to terminals T1, ... TJ, ... and T28. Typical detection circuit DJ centers on a voltage comparator K having inverting and non-inverting input terminals respectively at input and reference voltages $V_{TI}$ and $V_{TR}$. Comparator K compares voltages $V_{TI}$ and $V_{TR}$ to provide its output terminal with an output signal $V_{TO}$ dependent on the comparison. Output $V_{TO}$ is at a high voltage if voltage $V_{TR}$ exceeds voltage $V_{TI}$ by a small amount which is negligible here. Output $V_{TO}$ is at a low voltage if voltage $V_{TR}$ is less than or equal to voltage $V_{TI}$. Resistors RX and RY whose junction is connected to terminal TJ are serially connected between the inverting input terminal and a detection supply point X at a detection supply voltage $V_{TX}$. Comparator K has low and high supply voltage terminals connected respectively to supply lines 20 and 22 at respective variable low and high supply voltages $V_{SL}$ and $V_{SH}$. An LED L connected between line 20 and the output terminal provides a visual display of the state of output $V_{TO}$. A resistor RZ is connected between the output terminal and line 22.

Comparator K in each circuit DJ is preferably one-fourth of a Signetics LM339 bipolar voltage comparator or equivalent. For details on the LM339, see *Analog Data Manual*, Signetics Corp., 1981, pages 199–203. The LM339 is the type of comparator in which current only flows out of the inverting and non-inverting input terminals when their voltages are less than or equal to a specified voltage below the voltage ($V_{SH}$) at the high supply voltage terminal. For the LM339, this specified voltage is about 1.5 volts at room temperature. The non-inverting input terminal to comparator K is preferably open circuited. As a result, reference voltage $V_{TR}$ goes to about 0.5 volt ($\pm 0.1$–0.2 volt) above the voltage ($V_{SL}$) at the low supply voltage terminal. Resistors RX and RY are each $10^7$ ohms, and resistor RZ is 680 ohms.

Each of detection circuits D1–D28 is connected to supply point X and lines 20 and 22 in the manner described for circuit DJ. Circuits D1–D28 are also connected directly to their associated terminals T1–T28 as described for circuit DJ except for circuit D22 which is coupled to terminal T22 through a switch S1 as further described below. The 28 LED's L for circuits D1–D28 are arranged in an array 24 on box 14.

LED's LC and LL provide a visual indication of whether the tester is in the continuity or leakage test mode. LED LC is connected in series with a resistor RC between line 22 and a terminal for a fixed supply voltage $V_C$. LED LL is connected in series with a resistor RL between line 22 and a terminal for a fixed intermediate supply voltage $V_B$. Resistors RC and RL are each 680 ohms.

The transition between continuity and leakage testing is accomplished with a supply switching circuit 26 consisting of switches S1 and S2. Switch S1 is a standard 4-pole double-throw 2-position switch having four switching elements that move as a unit from continuity test positions to leakage test positions. The S1 continuity test positions are the upper positions in FIG. 2. The four S1 poles are respectively connected to terminal T22, to a terminal for a fixed low supply voltage $V_A$, to the $V_B$ terminal, and to the $V_C$ terminal. During continuity test, they are respectively connected to circuit D22, to line 20, to line 22, and to a line 26 connecting to switch S2. During leakage test, they are respectively connected to a switch S3 by way of a resistor R1, to terminal T14 through a line 30, to line 20, and to line 22. A resistor R2 is connected between the $V_C$ terminal and line 30. Resistors R1 and R2 are $10^7$ and $10^5$ ohms, respectively.

Switch S2 contains PNP and NPN transistors Q1 and Q2 whose collectors are connected together at supply point X. Transistors Q1 and Q2 have their emitters respectively tied to the $V_C$ and $V_A$ terminals, while their bases are respectively coupled through resistors R3 and R4 to line 28. A resistor R5 is connected between the $V_A$ terminal and line 28. Resistors R3–R5 are each $10^5$ ohms. During continuity test, transistor Q1 is off. Transistor Q2 is on and pulls voltage $V_{TX}$ down to approximately $V_A$. During leakage test, transistor Q2 is off. Transistor Q1 is on and pulls voltage $V_{TX}$ up to approximately $V_C$.

Switch S3 is a standard 1-pole double-throw 2-position switch. Its pole is connected to resistor R1 and switches between voltages $V_A$ and $V_B$. Lead 22 (20) on the 28-lead (24-lead) IC under test is the select/deselect lead. During leakage test, moving switch S3 to voltage $V_B$ selects or deselects the IC output leads depending on the type of IC under test, while moving switch S3 to voltage $V_A$ does the reverse.

A standard 1-pole double-throw 3-position switch S4 allows voltage $V_B$ to be applied to the $V_{DD}$ lead of either the 24-lead or 28-lead IC during leakage test. The S1 pole is coupled through a current-monitor jack 32 to the $V_B$ terminal. A current measuring device can be plugged into jack 32 to determine the current flowing through the $V_{DD}$ lead during leakage testing. The S1 pole is switched between terminal T28 for 28-lead IC's and terminal T26 (24) for 24-lead IC's. During continuity test, switch S3 is moved to an open-circuit position represented by the notation "NC" in the drawings.

In addition to socket 16, IC 10 has another socket 34 arranged similarly to contact structure 16 for receiving the leads of a 24-lead IC mounted on a plug-in printed circuit board. The test terminals of socket 34 are interconnected with switching circuit 26 in the same way as socket 16.

Figure 4:
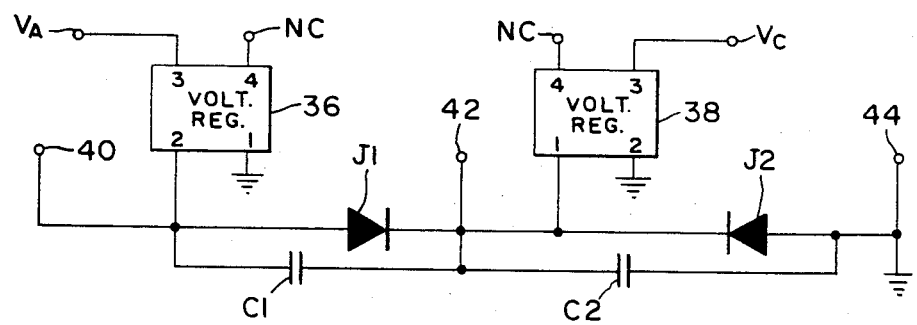
FIG. 4 is a circuit diagram of a voltage regulator used with the tester of FIGS. 2 and 3.

Supply voltages $V_A$, $V_B$, and $V_C$ are preferably −5, 0, and +5 volts, respectively. Voltages $V_A$ and $V_C$ are provided from a voltage regulating circuit illustrated in FIG. 4. This regulating circuit consists of IC's 36 and 38, 10-microfarad capacitors J1 and J2, and PN diodes D1 and D2 connected as shown. IC's 36 and 38 are respectively MC7905 and MC7805 3-terminal voltage regulators made by Motorola, Inc. Terminals 40 and 42 respectively receive supply voltages at −10 and +10 volts from a conventional power supply. Voltage $V_B$ is supplied at ground potential at a terminal 44.

Letting voltages $V_{TA}$ and $V_{TB}$ respectively represent the voltage at terminal T14 that contacts the $V_{SS}$ lead and the voltage at terminal T28 or T26 (24) that contacts the $V_{DD}$ lead, the testing device operates in the following way. During continuity testing, the tester satisfies the inequality:

$$V_{TA} - V_{SP} - V_{TX} > V_{TR} - V_{TX} > 0 \tag{1}$$

where $V_{SP}$ is a specified voltage dependent on the continuity characteristics of the IC under test. Typically, the parasitic diodes represented by diode JP predominate during continuity test—i.e., diode JP transmits nearly all of the current flowing from the $V_{SS}$ lead to lead PJ. Voltage $V_{SP}$ is then slightly greater than the conductive voltage drop across diode JP.

During leakage testing, the tester satisfies the largely converse inequality:

$$V_{TX} > V_{TR} > V_{TB} > V_{TA} \tag{2}$$

Supply switching circuit 26 enables the tester to meet both inequalities by appropriately adjusting voltages $V_{TA}$ and $V_{TX}$ in switching between continuity and leakage modes and by providing voltage $V_{TB}$ at a suitable value during leakage testing.

Circuit D14 does not actually test either the continuity or leakage condition at the $V_{SS}$ lead. If, however, a lead other than lead 14 (12) were the $V_{SS}$ lead for some 28-lead (24-lead) IC's, an additional switch could be employed in the tester to switch voltage $V_{TA}$ from terminal T14 (12) to the alternate $V_{TA}$ test terminal so that circuit D14 becomes functionally active—i.e., provides valid information. Circuits D22 (20) and D28 are functionally active during continuity test but not during leakage test.

Figure 5:
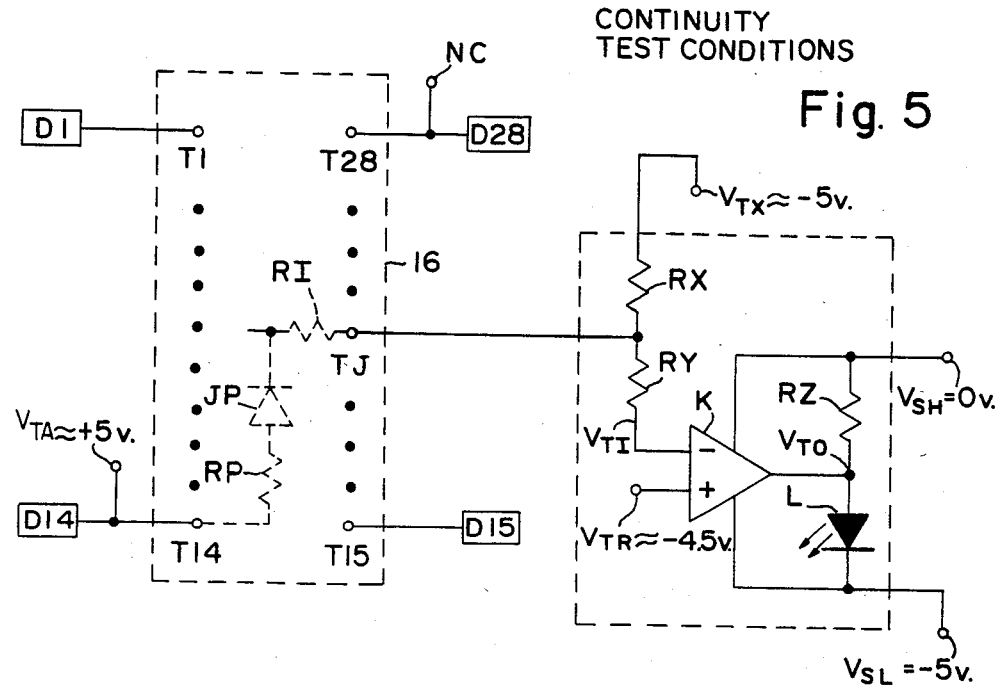
FIGS. 5 and 6 are partial circuit diagrams respectively indicating continuity and leakage test conditions for the tester of FIG. 2.
Figure 6:
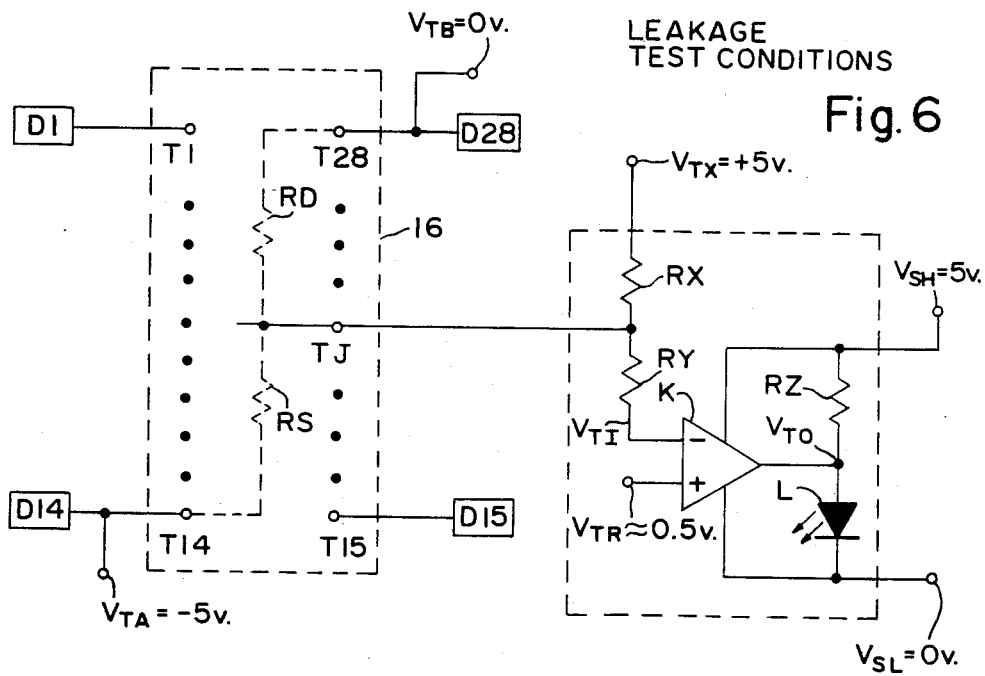

Further understanding of the operation is facilitated with the assistance of FIGS. 5 and 6. They respectively illustrate continuity and leakage conditions in the tester for the above parameter values. IC 10 under test here is a 28-lead IC in which diode JP is the element that allows continuity to be checked at lead PJ. Accordingly, FIG. 5 indicates the connections of diode JP and resistors RP and RI when IC 10 is in the tester. Resistor RP is typically about 100 ohms. FIG. 6 similarly indicates the connections of leakage resistors RS and RD.

For continuity testing, circuit 26 sets voltages $V_{TA}$, $V_{TX}$, $V_{SL}$, and $V_{SH}$ at the values shown in FIG. 5. Voltage $V_{TR}$ goes to about −4.5 volts. Voltage $V_{SP}$ is, for example, about 1 volt since this is slightly more than the maximum voltage across diode JP. Inequality (1) is thereby satisfied. LED LC is turned on to indicate continuity testing, while LED LL is off.

If continuity exists at lead PJ, resistor RI has a sufficiently low value that the current flowing from the $V_{SS}$ lead to lead PJ is about 100 nanoamperes or more. For example, the voltage at terminal TJ is around 4 volts if resistor RI is quite small compared to resistor RX. This voltage is too high to allow current to flow out of the inverting input terminal of comparator K. Voltage $V_{TI}$ is higher than $V_{TR}$. Assuming, for example, that comparator K has an internal impedance of about $2 \times 10^7$ ohms between its inverting input terminal and its low supply voltage ($V_{SL}$) terminal, leakage current flowing into the inverting terminal brings voltage $V_{TI}$ to around 3 volts. Comparator K provides its output $V_{TO}$ at a low voltage near the $V_{SL}$ level of −5 volts. LED L is turned off to indicate the presence of continuity.

If there is a lack of continuity at lead PJ, resistor RI is so large that the current flowing through diode JP is below the foregoing level. Current flows out of the inverting input terminal through resistors RX and RY to supply point X. Due to the characteristics of comparator K, this current is limited to such a value that voltage $V_{TI}$ is somewhat below $V_{TR}$. Output $V_{TO}$ goes to a high value about 0.7 volt above $V_{SL}$ to turn on LED L and indicate a continuity failure.

Continuity is checked in the foregoing manner at each lead PJ except the $V_{SS}$ and $V_{DD}$ leads. The only difference for the $V_{DD}$ lead is that its continuity current path to the $V_{SS}$ lead goes through various FET's and other intervening IC elements (all of which typically have a total resistance on the order of 100 ohms) instead of going through elements DP and RP. Detection circuit D28 for the $V_{DD}$ lead operates as described above. As to the $V_{SS}$ lead, its continuity is implicitly determined by the continuity conditions at the other leads. If at least one of them is continuous (as indicated by corresponding LED L), continuity exists at the $V_{SS}$ lead. In circuit D14, LED L is turned off. Its condition is, however, ignored.

For leakage testing, circuit 26 sets voltages $V_{TA}$, $V_{TB}$, $V_{TX}$, $V_{SL}$, and $V_{SH}$ at the values shown in FIG. 6. Note that supply voltages $V_{SL}$ and $V_{SH}$ are switched to values 5 volts higher than those occurring during continuity testing. This allows LED LL to turn on and indicate leakage mode testing. LED LC is off. Voltage $V_{TR}$ goes to about 0.5 volt since voltages $V_{SL}$ and $V_{SH}$ are 5 volts higher. Inequality (2) is therefore met.

If the combined current leakage through resistors RS or RD is below about 180 nanoamperes, a small current from supply point X flows through resistor RX to terminal TJ. Some leakage current flows into the inverting input terminal of comparator K. Consequently, voltage $V_{TI}$ is at least as high as $V_{TR}$. If, for example, there was absolutely no leakage, voltage $V_{TI}$ might be around 2–3 volts. Voltage $V_{TO}$ is provided at a low value near the 0-volt $V_{SL}$ level. LED L is off to indicate that leakage is not excessive.

If leakage through resistor RS or RD is above the preceding level, current flows through resistor RX and through one or both of resistors RS and RD to pull down the voltage at terminal TJ. Current from the inverting input terminal flows through resistor RY to pull voltage $V_{TI}$ somewhat below $V_{TR}$. Output $V_{TO}$ goes to a high value about 0.7 volt above $V_{SL}$. This turns on LED L to indicate a leakage failure.

There is no leakage testing at the $V_{SS}$ and $V_{DD}$ leads or at select/deselect lead 22 which is decoupled from circuit D22. Although LED L in circuit D14 or D28 is actually turned on while LED L in circuit D22 is turned off, the conditions of these three LED's are ignored during leakage test.

While the invention has been described with reference to a particular embodiment, this description is solely for the purpose of illustration and is not to be construed as limiting the scope of the invention claimed below. For example, the lead contact structure could be adapted to accommodate electronic circuits having leads in various configurations besides those described above. P-channel IC's and the like could also be tested; in this case, the signs in Inequalities (1) and (2) must be reversed.

Further switching circuitry could be added to permit testing of electronic circuits having three different supply voltages. The tester could then, for example, be switched from the low and intermediate supply voltage leads in one set of continuity/leakage tests to the intermediate and high supply voltage leads in another set of continuity/leakage tests. This principle applies to a greater number of supply voltages. Thus, various modifications, changes, and applications may be made by those skilled in the art without departing from the true scope and spirit of the invention as defined by the appended claims.

What is claimed is:

1. A device for testing an electronic circuit having a set of electrical leads of which a first and a second are supply voltage leads, the device comprising:
   contact means having test terminals for contacting the leads on a one-to-one basis, a first and a second of the test terminals respectively contactable with the first and second leads;
   a supply point;
   at least one detection circuit corresponding on a one-to-one basis to at least part of the test terminals, each detection circuit comprising:
   a resistor coupled between the supply point and the corresponding test terminal; and
   comparing means having a first input terminal coupled to the corresponding test terminal for receiving an input voltage, a second input terminal at a reference voltage $V_{TR}$, and an output terminal for providing an output signal at one of a pair of opposite states depending on whether the input and reference voltages are in a specified relationship; and
   supply switching means for providing the first test terminal with a first test supply voltage $V_{TA}$, for providing the supply point with a detection supply voltage $V_{TX}$, and for switching the supply voltages between values suitable for testing continuity at the leads and values suitable for testing current leakage from at least one selected one of the leads to the first lead.

2. A device as in claim 1 wherein continuity at each selected lead is characterized by current flow between that selected lead and the first lead, the direction of this current flow being opposite to the direction of leakage current flowing between the first lead and that selected lead.

3. A device as in claim 2 wherein the direction of current flow through each resistor switches in switching between continuity testing and current leakage testing.

4. A device as in claim 1 wherein the supply switching means provides the second test terminal with a second test supply voltage $V_{TB}$ for testing current leakage from at least one selected one of the leads to the second lead.

5. A device as in claim 4 wherein each selected lead is not one of the supply voltage leads.

6. A device as in claim 4 wherein one of the states of the output signal of the comparing means in each detection circuit represents presence of continuity or lack of current leakage beyond a specified level at the corresponding lead and the other state respectively represents absence of continuity or existence of current leakage beyond the specified level at the corresponding lead.

7. A device as in claim 6 wherein each detection circuit includes a display element for visually indicating the state of the output signal of the comparing means in that detection circuit.

8. A device as in claim 7 wherein each display element comprises a light-emitting diode.

9. A device as in claim 1 wherein the supply switching means switches the supply voltages (1) between first-type continuity-test values in which $V_{TA}-V_{SP}-V_{TX}>V_{TR}-V_{TX}>0$ for each detection means and first-type leakage-test values in which $V_{TA}>V_{TR}>V_{TX}$ for each detection means or (2) second-type continuity-test values in which $V_{TA}-V_{SP}-V_{TX}>V_{TR}-V_{TX}>0$ for each detection means and second-type leakage-type values in which $V_{TA}>V_{TR}>V_{TX}$ for each detection means, where $V_{SP}$ is a specified voltage depending on the characteristics of the electronic circuit.

10. A device as in claim 9 wherein the supply switching means provides the second test terminal with a second test supply voltage $V_{TB}$ at a value between $V_{TA}$ and $V_{TR}$ for testing current leakage from at least one selected one of the leads to the second lead.

11. A device as in claim 10 wherein the supply switching means switches the second test terminal to an open circuit position for continuity testing.

* * * * *

UNITED STATES PATENT AND TRADEMARK OFFICE
CERTIFICATE OF CORRECTION

PATENT NO. : 4,578,637
DATED : Mar. 25, 1986
INVENTOR(S) : RICHARD J. ALLEN and RICHARD W. YOUDEN It is certified that error appears in the above-identified patent and that said Letters Patent is hereby corrected as shown below:

Claim 9, line 6, "$V_{TA} > V_{TR} > V_{TX}$" should read $$-- \quad V_{TA} < V_{TR} < V_{TX} \quad --;$$

line 8, "$V_{TA} - V_{SP} - V_{TX} > V_{TR} - V_{TX} > 0$" should read $$-- \quad V_{TA} - V_{SP} - V_{TX} < V_{TR} - V_{TX} < 0 \quad --.$$

Signed and Sealed this

Twelfth Day of August 1986

[SEAL]

Attest:

DONALD J. QUIGG

Attesting Officer

Commissioner of Patents and Trademarks